United States Patent
Yu et al.

(10) Patent No.: US 7,805,655 B2
(45) Date of Patent: *Sep. 28, 2010

(54) TURBO STREAM PROCESSING DEVICE AND METHOD

(75) Inventors: Jung-pil Yu, Suwon-si (KR); Hae-joo Jeong, Seoul (KR); Eui-Jun Park, Seoul (KR); Joon-soo Kim, Seoul (KR); Yong-sik Kwon, Seoul (KR); Jin-Hee Jeong, Anyang-si (KR); Yong-deok Chang, Suwon-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1078 days.

This patent is subject to a terminal disclaimer.

(21) Appl. No.: 11/504,038

(22) Filed: Aug. 15, 2006

(65) Prior Publication Data

US 2007/0113145 A1    May 17, 2007

Related U.S. Application Data

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005, provisional application No. 60/788,707, filed on Apr. 4, 2006.

(30) Foreign Application Priority Data

Jul. 20, 2006   (KR)   .................... 10-2006-0068061

(51) Int. Cl.
*H03M 13/00*   (2006.01)

(52) U.S. Cl. ................. 714/755; 714/786; 714/762; 714/788

(58) Field of Classification Search ............... 714/755, 714/786, 762, 788
See application file for complete search history.

(56) References Cited

U.S. PATENT DOCUMENTS 5,875,007 A    2/1999  Zhung et al.

(Continued)

FOREIGN PATENT DOCUMENTS

CN    1466378 A    1/2004

(Continued)

OTHER PUBLICATIONS

Search Report issued on Feb. 2, 2007 by the Korean Intellectual Property Office for International Patent Application No. PCT/KR2006/004300.

(Continued)

*Primary Examiner*—Guy J Lamarre
(74) *Attorney, Agent, or Firm*—Sughrue Mion, PLLC

(57) ABSTRACT

A turbo stream processing device and method. A turbo stream processing device includes a turbo stream detector to receive a dual transmission stream in which a turbo stream and a normal stream are multiplexed, and to detect the turbo stream; an outer encoder to encode the turbo stream; an outer encoder to interleave the turbo stream which is encoded at the outer encoder; and a turbo stream stuffer to reconstruct the dual transmission stream by stuffing the interleaved turbo stream into the dual transmission stream. Accordingly, the reception performance can be enhanced by more robustly processing the turbo stream in the dual transmission stream.

16 Claims, 6 Drawing Sheets

U.S. PATENT DOCUMENTS

| | | | |
|---|---|---|---|
| 5,959,672 A | | 9/1999 | Sasaki |
| 6,029,264 A | * | 2/2000 | Kobayashi et al. ........... 714/755 |
| 7,254,184 B2 | * | 8/2007 | Buljore et al. .............. 375/295 |
| 2004/0090997 A1 | | 5/2004 | Choi et al. |
| 2005/0128966 A1 | * | 6/2005 | Yee ........................... 370/310 |
| 2009/0037794 A1 | | 2/2009 | Choi et al. |

FOREIGN PATENT DOCUMENTS

CN              1543219 A      11/2004

OTHER PUBLICATIONS

International Search Report mailed Feb. 2, 2007, in International Application No. PCT/KR2006/004300.
Written Opinion of the International Searching Authority mailed on Feb. 2, 2007, in International Application No. PCT/KR2006/004300.
U.S. Appl. No. 11/416,254, filed May 3, 2006, Jung-pil Yu et al., Samsung Electronics Co., Ltd.
U.S. Appl. No. 11/416,258, filed May 3, 2006, Yong-sik Kwon et al., Samsung Electronics Co., Ltd.
U.S. Appl. No. 11/416,457, filed May 3, 2006, Jung-pil Yu et al., Samsung Electronics Co., Ltd.
U.S. Appl. No. 11/503,970, filed Aug. 15, 2006, Jung-pil Yu et al., Samsung Electronics Co., Ltd.
U.S. Appl. No. 11/504,024, filed Aug. 15, 2006, Jung-pil Yu et al., Samsung Electronics Co., Ltd.
U.S. Appl. No. 11/504,027, filed Aug. 15, 2006, Jung-pil Yu et al., Samsung Electronics Co., Ltd.
U.S. Appl. No. 11/504,029, filed Aug. 15, 2006, Jung-pil Yu et al., Samsung Electronics Co., Ltd.
U.S. Appl. No. 11/504,030, filed Aug. 15, 2006, Jung-pil Yu et al., Samsung Electronics Co., Ltd.
U.S. Appl. No. 11/504,031, filed Aug. 15, 2006, Jung-pil Yu et al., Samsung Electronics Co., Ltd.
U.S. Appl. No. 11/504,651, filed Aug. 16, 2006, Jung-pil Yu et al., Samsung Electronics Co., Ltd.
U.S. Appl. No. 11/504,724, filed Aug. 16, 2006, Jung-pil Yu et al., Samsung Electronics Co., Ltd.
U.S. Appl. No. 11/504,725, filed Aug. 16, 2006, Jung-pil Yu et al., Samsung Electronics Co., Ltd.
U.S. Appl. No. 11/504,726, filed Aug. 16, 2006, Jung-pil Yu et al., Samsung Electronics Co., Ltd.
U.S. Appl. No. 11/505,369, filed Aug. 17, 2006, Jung-pil Yu et al., Samsung Electronics Co., Ltd.
U.S. Appl. No. 11/505,894, filed Aug. 18, 2006, Eui-jun Park et al., Samsung Electronics Co., Ltd.
U.S. Appl. No. 11/508,144, filed Aug. 23, 2006, Jung-pil Yu et al., Samsung Electronics Co., Ltd.
U.S. Appl. No. 11/523,716, filed Sep. 20, 2006, Jung-pil Yu et al., Samsung Electronics Co., Ltd.
U.S. Appl. No. 11/692,509, filed Mar. 28, 2007, Hae-joo Jeong et al., Samsung Electronics Co., Ltd.
Office Action issued by State Intellectual Property Office of China in Chinese Patent Application No. 20060037456.9 on May 8, 2009.

\* cited by examiner

| SYNC | PID | Turbo Data |
|------|-----|------------|
| SYNC | PID | Normal Data |
| SYNC | PID | Normal Data |
| SYNC | PID | Normal Data |
| 1 | 3 | 184 |

TURBO STREAM PROCESSING DEVICE AND METHOD

CROSS-REFERENCE TO RELATED APPLICATIONS

This application claims the benefit of U.S. Provisional Patent Applications No. 60/728,777 filed Oct. 21, 2005, No. 60/734,295 filed Nov. 8, 2005, No. 60/738,050 filed Nov. 21, 2005, No. 60/739,448 filed Nov. 25, 2005, No. 60/788,707 filed Apr. 4, 2006, in the U.S. Patent and Trademark Office; and Korean Application No. 2006-68061, filed Jul. 20, 2006, in the Korean Intellectual Property Office, the disclosures of which are incorporated herein by reference.

BACKGROUND OF THE INVENTION

1. Field of the Invention

Aspects of the present invention generally relate to a turbo stream processing device and method for robustly processing a transmission stream for digital broadcasting. More particularly, aspects of the present invention relate to a turbo stream processing device and method for more robustly processing a turbo stream of a dual transmission stream which includes a normal stream and the turbo stream and transmitting the dual transmission stream to improve a reception performance of an Advanced Television Systems Committed (ATSC) Vestigial Sideband—(VSB) system such as is used in the U.S.A. terrestrial Digital Television (DTV) system.

2. Description of the Related Art

A single-carrier ATSC VSB system, such as is used in the U.S.A. terrestrial digital broadcasting system, uses a single field sync per 312 segments. Hence, its reception performance is not good in a poor channel environment, especially, in a Doppler fading channel.

FIG. 1 is a block diagram of a transmitter and a receiver, as used in a general U.S.A. terrestrial digital broadcasting system, in conformity with the ATSC DTV standard. The digital broadcasting transmitter of FIG. 1 uses the Enhanced Vestigial Sideband (EVSB) system suggested by Philips, and is constructed to generate and transmit a dual stream by adding robust data to a normal stream of the conventional ATSC VSB system.

As shown in FIG. 1, the digital broadcasting transmitter executes an error correction coding by including a randomizer 11 for randomizing the dual stream, a Reed-Solomon (RS) encoder 12 which is a concatenated encoder for adding a parity byte to the transmission stream to correct errors occurring due to the channel characteristics during the transmission, an interleaver 13 for interleaving the RS-encoded data in a certain pattern, and a trellis encoder 14 to map data to eight-level symbols by trellis-encoding the interleaved data at ⅔ rate.

The digital broadcasting transmitter further includes a multiplexer 15 for inserting field sync and segment sync into the data which passed through the error correction coding, as shown in FIG. 2. The digital broadcasting transmitter also includes a modulator 16 to insert a pilot tone by adding a certain DC value to the data symbols having the inserted segment sync and field sync; 2) perform a VSB modulation through a pulse shaping; 3) up-convert to an RF channel band signal, and 4) transmit the converted signal.

Accordingly, the digital broadcasting transmitter multiplexes (not shown) and applies the normal data and the robust data to the randomizer 11 according to the dual stream scheme which transmits the normal data and the robust data in one channel. The input data is randomized at the randomizer 11, the randomized data is outer-encoded (block encoded) at the RS encoder 12 which is an outer encoder, and the outer-encoded data is interleaved at the interleaver 13. The interleaved data is inner-encoded (convolution encoded) by twelve symbols at the trellis encoder 14 and mapped to eight-level symbols. The field sync and the segment sync are then inserted to the mapped data. Next, the pilot tone is inserted, VSB modulation is performed, and the result is converted to a radio (RF) signal. Finally, the RF signal is transmitted.

The digital broadcasting receiver of FIG. 1, includes a tuner (not shown) to convert the RF signal received through the channel into a baseband signal; a demodulator 21 to perform the sync detection and the demodulation of the converted baseband signal, an equalizer 22 to compensate for multipath-based channel distortion in the demodulated signal; a viterbi decoder 23 to correct errors in the equalized signal and to decode the equalized signal into symbol data; a deinterleaver 24 to deinterleave the decoded symbol data; an RS decoder 25 to correct errors; and a derandomizer 26 to derandomize the error-corrected data and output the resulting MPEG-2 transmission stream.

Hence, the digital broadcasting receiver of FIG. 1 recovers the original signal in the inverse operation of the digital broadcasting transmitter by down-converting the RF signal to the baseband signal, demodulating and equalizing the converted signal, and decoding the demodulated and equalized signal.

FIG. 2 shows an example VSB data frame (with inserted segment sync and field sync signals) such as is used in the U.S.A. digital broadcasting (8-VSB) system. As shown in FIG. 2, one frame consists of 2 fields. One field consists of a field sync segment, which is the first segment, and 312 data segments. In the VSB data frame, each segment corresponds to one MPEG-2 packet, and consists of a 4-symbol segment sync and 828 data symbols.

In FIG. 2, the segment sync signal and the field sync signal are used by the digital broadcasting receiver for synchronization and equalization. In other words, the contents of the field sync and the segment sync are previously known to both the digital broadcasting transmitter and the digital broadcasting receiver and used as reference signals to synchronize and equalize the transmission received by the digital broadcasting receiver.

The U.S.A. terrestrial digital broadcasting system of FIG. 1 is constructed to generate and transmit a dual stream by adding the robust data to the normal data of the conventional ATSC VSB system in order to transmit the robust data and normal data together.

However, disadvantageously, the U.S.A. terrestrial digital broadcasting system of FIG. 1 cannot enhance the poor reception performance of the normal data stream in the multipath channel even when the transmitted dual stream includes the added robust data. That is, the reception performance is not improved at all even with the augmented normal stream. In addition, with respect to the turbo stream, the reception performance does not show great improvement in the multipath environment. Hereinafter, the normal data stream and turbo data stream are referred to as normal stream and turbo stream, respectively.

Therefore, a demand arises for a technique to more robustly process the turbo stream in order to enhance the reception performance in relation to the turbo stream.

SUMMARY OF THE INVENTION

An aspect of the present invention has been provided to solve the above-mentioned and/or other problems and disadvantages and an aspect of the present invention provides a turbo stream processing device and method for encoding and robustly processing only a turbo stream of a dual transmission stream which includes a normal stream and the turbo stream, so as to enhance the reception performance of the ATSC VSB system used in the U.S.A. terrestrial DTV system.

According to an aspect of the present invention, a turbo stream processing device includes a turbo stream detector to receive a dual transmission stream in which a turbo stream and a normal stream are multiplexed, and to detect the turbo stream; an outer encoder to encode the turbo stream; an outer interleaver to interleave the thus encoded turbo stream; and a turbo stream stuffer to reconstruct the dual transmission stream by stuffing the interleaved turbo stream into the dual transmission stream.

While not required in all aspects, the turbo stream processing device may further include a byte-symbol converter to receive a bytewise dual transmission stream, to convert the dual transmission stream to symbols, and to provide the converted dual transmission stream to the turbo stream detector; and a symbol-byte converter to convert the dual transmission stream, which is reconstructed at the turbo stream stuffer, from the symbols to bytes.

While not required in all aspects, the turbo stream processing device may further include a parity compensator to repair the parity data of the dual transmission stream after it is reconstructed by the turbo stream stuffer.

The outer encoder may include a bit detector to detect data bits within the detected turbo stream; an encoder to convolutionally encode the detected data bits; and a bit inserter to insert the encoded values into a parity insertion area provided in the turbo stream.

In this case, the encoder may include a first register; a second register to store a previously stored value, which is shifted from the first register when a new value is stored to the first register; and a third register to store a previously stored value, which is shifted from the second register when a new value is stored to the second register. The encoder may also include a first adder to sum an input bit value with the value of the first register when the input bit arrives, and with the value of the third register when the input bit arrives. The result of this summation is stored to the first register. The encoder may also include a second adder to sum the input bit value, the value of the first register when the input bit arrives, and the value of the second register. The result of the second summation is then output.

The parity insertion area may be a single bit which is positioned in succession immediately adjacent to its related data bit in the turbo stream.

Alternatively, the parity insertion area may be three bits which are positioned in succession immediately adjacent to their related data bit in the turbo stream.

In the second case, the bit inserter may insert the encoded parity value of a particular data bit into first and third bits of the three-bit parity area which is positioned in succession adjacent to the data bit, and insert an identical copy of that particular data bit into the second bit of the three-bit parity area.

According to another aspect of the present invention, a turbo stream processing method includes receiving a dual transmission stream in which a turbo stream and a normal stream are multiplexed, and detecting the turbo stream; encoding the turbo stream; interleaving the encoded turbo stream; and reconstructing the dual transmission stream by stuffing the interleaved turbo stream into the dual transmission stream.

While not required in all aspects, the turbo stream processing method may further include before the receiving of the dual transmission, and the detecting of the turbo stream, receiving the bytewise dual transmission stream and converting the dual transmission stream from bytes into symbols; and after the reconstructing of the dual transmission stream, converting the reconstructed dual transmission stream from the symbols into bytes.

While not required in all aspects, the turbo stream processing method may further include repairing the parity data of the reconstructed dual transmission stream.

The encoding of the turbo stream may include detecting data bits from the detected turbo stream, convolutionally encoding the data bits, and inserting the encoded values into the parity insertion area provided in the turbo stream. The convolutional encoding of the turbo stream, when included, may be done using three value-storing registers and two adders where the value of the first register is shifted to the second register when a new value is stored to the first register, and the value of the second register is shifted to the third register when a new value is stored to the second register; and where the first adder sums an input bit value with the value of the first register when the input bit arrives, and with the value of the third register when the input bit arrives, with the result of this summation stored to the first register; and where the second adder sums an input bit value with the value of the first register when the input bit arrives, and with the value of the second register when the input bit arrives, where the result of the second summation is the encoded output to be inserted into the parity bit area of the turbo stream.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
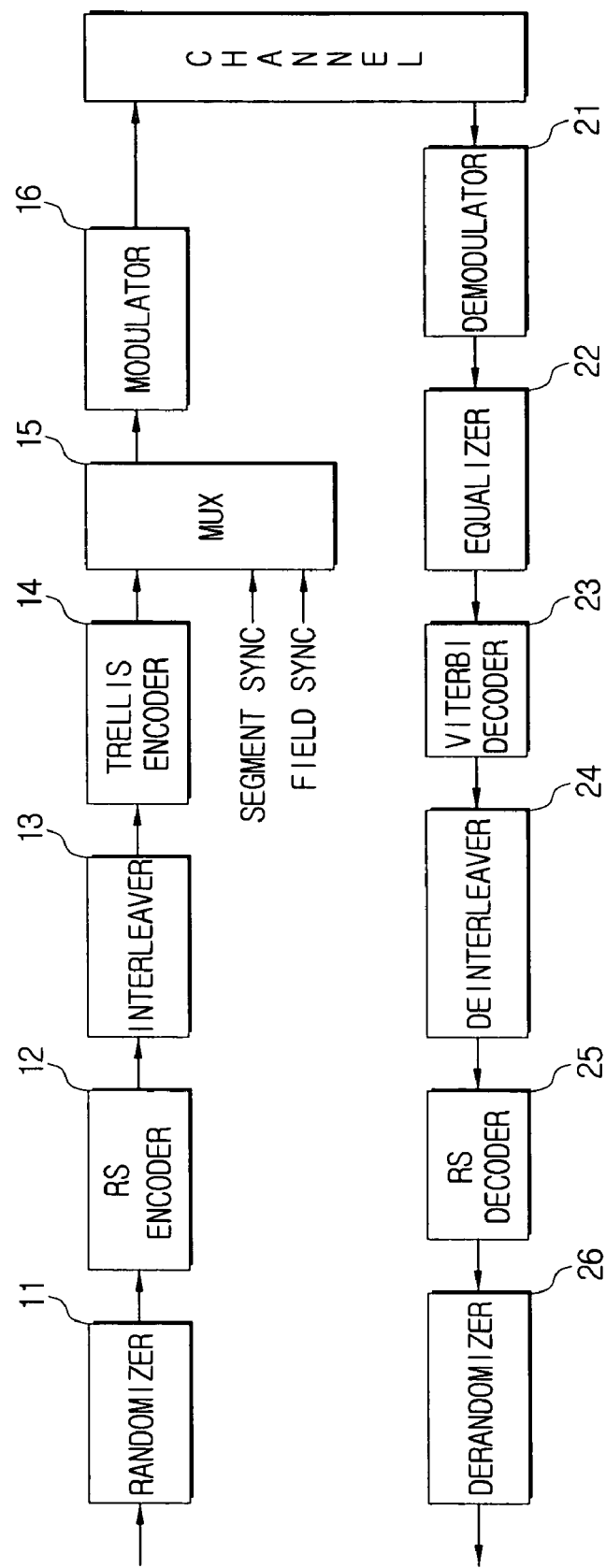
FIG. 1 is a block diagram of a conventional digital broadcasting (ATSC VSB) transmitter and receiver system.
Figure 2:
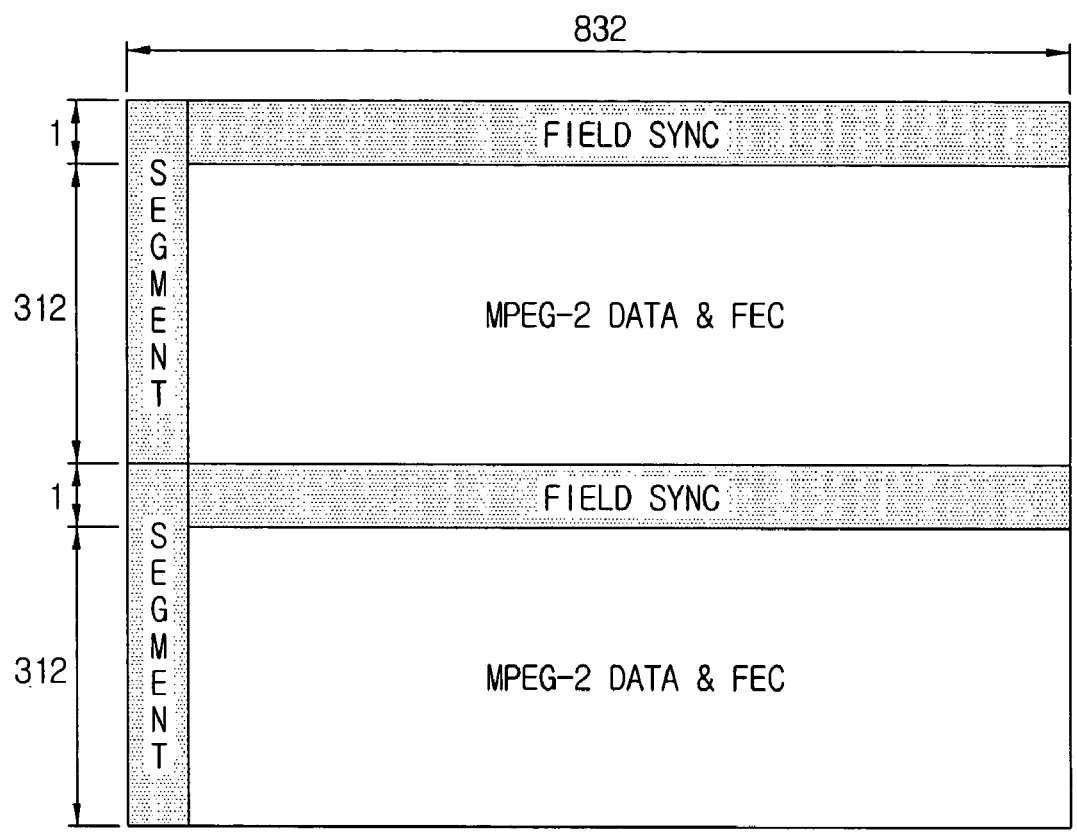
FIG. 2 is a diagram of an exemplary frame format of the conventional ATSC VSB data.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
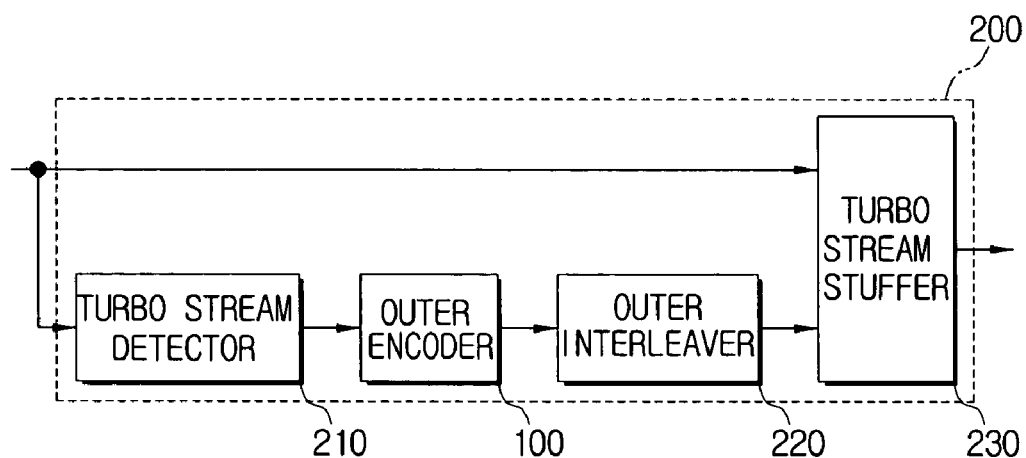
FIG. 3 is a block diagram of a turbo stream processing device according to one embodiment of the present invention.

FIG. 3 is a block diagram of a turbo stream processing device according to one embodiment of the present invention. Referring first to FIG. 3, the turbo stream processing device 200 includes a turbo stream detector 210, an outer encoder 100, an outer interleaver 220, and a turbo stream stuffer 230.

The turbo stream detector 210 is responsible for detecting a turbo stream within a dual transmission stream. The turbo stream is a data stream which is compressed according to a certain compression standard, such as MPEG-2, and robustly processed. In the turbo stream, a parity insertion area for inserting a parity value is provided. The turbo stream can be positioned in a specific packet of the dual transmission stream. More specifically, the dual transmission stream includes a field having a plurality of packets. The turbo stream is in packets of a specific position within the field. Other packets may contain a normal stream. The turbo stream detector 210 is capable of detecting the turbo stream according to the positions of the turbo stream packets.

The outer encoder 100 serves to encode the detected turbo stream. Specifically, the outer encoder 100 convolutionally encodes the turbo stream and inserts the encoded value into the parity insertion area of the turbo stream.

The outer interleaver 220 serves to interleave the encoded turbo stream. The outer interleaver 220 functions according to a certain interleaving rule. For instance, when ABCD is input in that order with the interleaving rule of {2, 1, 3, 0}, it is interleaved and output as DBAC.

The turbo stream stuffer 230 reconstructs the dual transmission stream by stuffing the interleaved turbo stream into the dual transmission stream. Accordingly, the turbo stream can be robustly processed without having to process the whole dual transmission stream.

Figure 4:
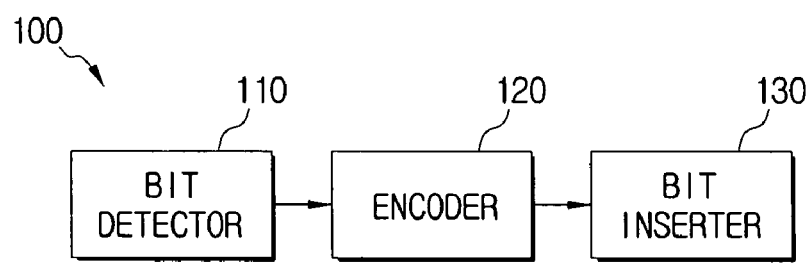
FIG. 4 is a block diagram of an outer encoder which is employed in the turbo stream processing device of FIG. 3.

FIG. 4 is a block diagram of the outer encoder 100 which is employed in the turbo stream processing device of FIG. 3. Referring to FIG. 4, the outer encoder 100 includes a bit detector 110, an encoder 120, and a bit inserter 130. The outer encoder 100 encodes the turbo stream detected at the turbo stream detector 210.

The bit detector 110 receives the turbo stream from the turbo stream detector 210 and detects only data bits from the turbo stream. The bit detector 110 detects bits in areas other than the parity insertion area as data bits. In more detail, the bit detector 110 detects a certain number of data bits according to the conversion rate of the turbo stream. For instance, when the turbo stream with the parity insertion area is provided at a ½ conversion rate, four data bits are detected from each byte. When the turbo stream with the parity insertion area is provided with a ¼ conversion rate, 2 data bits are detected from each byte.

The encoder 120 convolutionally encodes the detected data bits in the form of a recursive systematic convolutional (RSC) code.

The bit inserter 130 inserts the value encoded at the encoder 120 into the parity insertion area of the turbo stream.

An operation of the outer encoder 100 is described in detail as follows. The encoder 120 encodes at the ½ rate when the parity insertion area is a single bit which is positioned in succession adjacent to the bit, of one byte. Suppose that a byte of D7 0 D6 0 D5 0 D4 0 is received, the bit detector 110 detects D7, D6, D5 and D4 bits. The encoder 120 outputs encoding values of Z7, Z6, Z5, and Z4 corresponding to D7, D6, D5, and D4 in sequence. The bit inserter 130 arranges the encoding values which are output in order of Z7, Z6, Z5, and Z4 and inserts the arranged values to the parity insertion area in order of Z4, Z5, Z6, and Z7. Consequently, the outer encoder 100 encodes the byte of D7 0 D6 0 D5 0 D4 0 and outputs the byte such as D7 Z7 D6 Z6 D5 Z5 D4 Z4. Although the present embodiment indicates the parity value follows the data value, the invention is not limited thereto, that is, the received byte may be 0 D7 0 D6 0 D5 0 D4 and the outer encoder 100 may output the byte as Z7 D7 Z6 D6 Z5 D5 Z4 D4.

In a case where the parity insertion area is three bits which is positioned in succession adjacent to the data bit, of one byte, the encoder 120 encodes it at the ¼ rate. For example, if a byte of D7 0 0 0 D6 0 0 0 is received, the bit detector 110 detects D6 and D7 bits in sequence. Next, the detected bits are arranged in order of D7 and D6 and input to the encoder 120, and the encoder 120 outputs the encoding value of Z7 and Z6 corresponding to D7 and D6. The bit inserter 130 arranges Z7 and Z6 in the reverse order and stuffs them into the parity insertion area. That is, the bit inserter 130 stuffs Z6 and Z7 into the parity insertion area in that order. In this case, each encoding value is inserted to first and third bits of the parity insertion area which consists of three consecutive bits before or after one data bit. A value identical to each data bit is copied to the second bit of the parity insertion area. As a result, when the byte of D7 0 0 0 D6 0 0 0 is encoded, the byte of D7 Z7 D7 Z7 D6 Z6 D6 Z6 is output. Although the present embodiment indicates the parity value follows the data value, the invention is not limited thereto, that is, the received byte may be 0 0 0 D7 0 0 0 D6 and the outer encoder 100 may output the byte as Z7 D7 Z7 D7 Z6 D6 Z6 D6.

Figure 5:
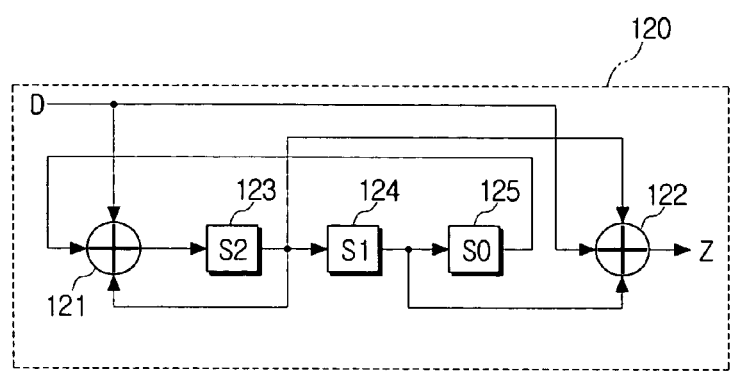
FIG. 5 is a conceptual diagram of a detailed construction of the encoder which constructs the outer encoder of FIG. 4.

FIG. 5 is a conceptual diagram of a detailed construction of the encoder 120. Referring to FIG. 5, the encoder 120 includes first and second adders 121 and 122, and three registers S2, S1, and S0 of which reference numbers are 123, 124 and 125, respectively.

The first adder 121 adds the input bit value, the value of the first register S2 123, and the value of the third register S0 125, and stores the resultant value to the first register S2 123. When this resultant value of the first adder 121 is stored to the first register S2 123, the previous value of the first register S2 123 is shifted to the second register S1 124. In this case, the previous value of the first register S2 123 is also provided to the second adder 122. The previous value of the second register, now replaced by the previous value of the first register, is shifted to the third register S0 125, and is also provided to the second adder 122. The previous value of the third register S0 125, now replaced by the previous value of the second register S1 124, is shifted to the first adder 121, where it awaits the next input bit value. Meanwhile the second adder 122 adds the input bit value to the previous value of the first register S2 123 and the previous value of the second register S1 124 (for example, both provided while being shifted as shown in FIG. 5) and outputs the resultant value. The value output from the second adder 122 is the encoding value Z. This process recurs for each input bit value. Thus, the convolution encoding is carried out in the form of the RSC code.

Figure 6:
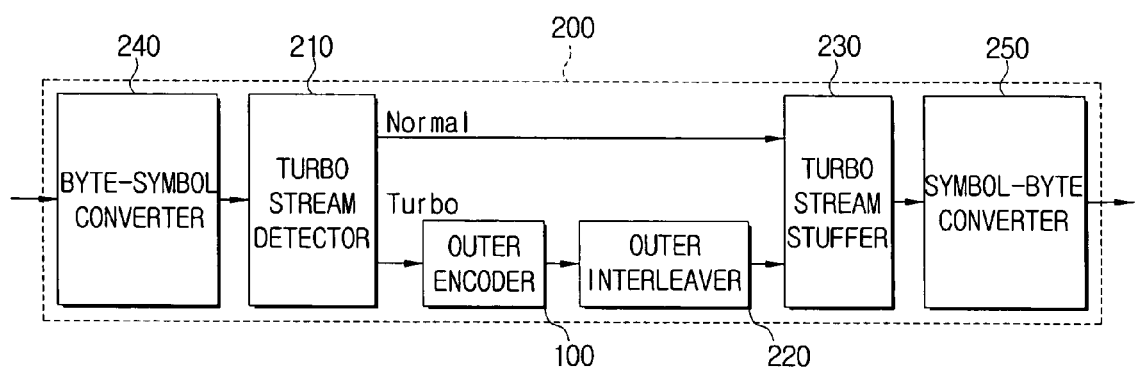
FIG. 6 is a block diagram of a turbo stream processing device according to another embodiment of the present invention.

FIG. 6 is a block diagram of a turbo stream processing device according to another embodiment of the present invention. Referring to FIG. 6, the turbo stream processing device 200 includes a byte-symbol converter 240, a turbo stream detector 210, an outer encoder 100, an outer interleaver 220, a turbo stream stuffer 230, and a symbol-byte converter 250.

The byte-symbol converter 240 receives the bytewise dual transmission stream and converts it to symbols. One of ordinary skill in the art can easily understand the byte-to-symbol conversion based on Table D5.2 of the U.S.A. ATSC DTV standard (A/53E), Dec. 27, 2005, Amendment No. 1, Apr. 18, 2006. The dual transmission stream converted to the symbols is applied to the turbo stream detector 210.

The turbo stream detector 210 detects the turbo stream from the dual transmission stream provided from the byte-symbol converter 240. The outer encoder 100 and the outer interleaver 220 encode and interleave the detected turbo stream, and the turbo stream stuffer 230 stuffs the dual transmission stream with the turbo stream output from the outer interleaver 220.

The symbol-byte converter 250 converts the dual transmission stream from the symbols to bytes. One of ordinary skill in the art can easily understand the symbol-to-byte conversion based on Table D5.2 of the U.S.A. ATSC DTV standard (A/53).

Figures 7, 8:
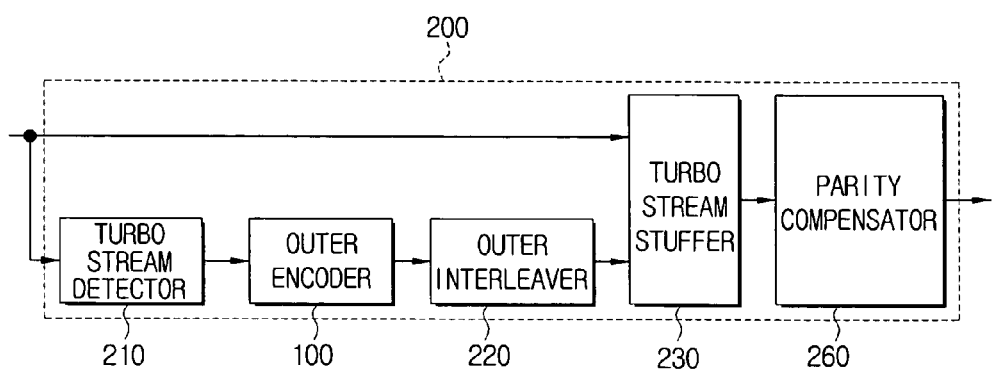
FIG. 7 is a block diagram of a turbo stream processing device according to still another embodiment of the present invention.
FIG. 8 is a conceptual diagram of an exemplary format of the dual transmission stream.

FIG. 7 is a block diagram of a turbo stream processing device according to still another embodiment of the present invention. Referring to FIG. 7, the turbo stream processing device 200 can include a parity compensator 260 in addition to a turbo stream detector 210, an outer encoder 100, an outer interleaver 220, and a turbo stream stuffer 230.

The parity compensator 260 compensates the parity error resulting from the encoding and the interleaving of the turbo stream. More specifically, the parity compensator 260 regenerates the parity data of the dual transmission stream which is reconstructed at the turbo stream stuffer 230 and adds the regenerated parity data to the dual transmission stream.

Although only the parity compensator 260 is further included in FIG. 7, it is understood that the byte-symbol converter 240 and the symbol-byte converter 250 of FIG. 6 can also be employed in the turbo stream processing device 200 of FIG. 7.

FIG. 8 is a conceptual diagram of an exemplary format of the dual transmission stream which is transmitted from the digital broadcasting transmission system according to aspects of the present invention. Referring to FIG. 8, the dual transmission stream consists of a plurality of consecutive packets. One packet can consist of 188 bytes. Described in further detail, the packet consists of a 1-byte sync, a 3-byte packet identity (PID), and a 184-byte data area. As shown in FIG. 8, the robust data, that is, the turbo stream is positioned in some packets of the dual transmission stream. Specifically, FIG. 8 illustrates that 78 turbo stream packets are stuffed into 312 packets of one field of the dual transmission stream. In this case, the dual transmission stream is constructed such that the turbo stream packet and the normal stream packet are arranged in the ratio of 1:3 by 4 packets. In other words, one turbo stream packet of 188 bytes and three normal stream packets of 188 bytes are arranged in sequence. Note that the construction of the dual transmission stream may vary according to various embodiments of the present invention.

Figure 9:
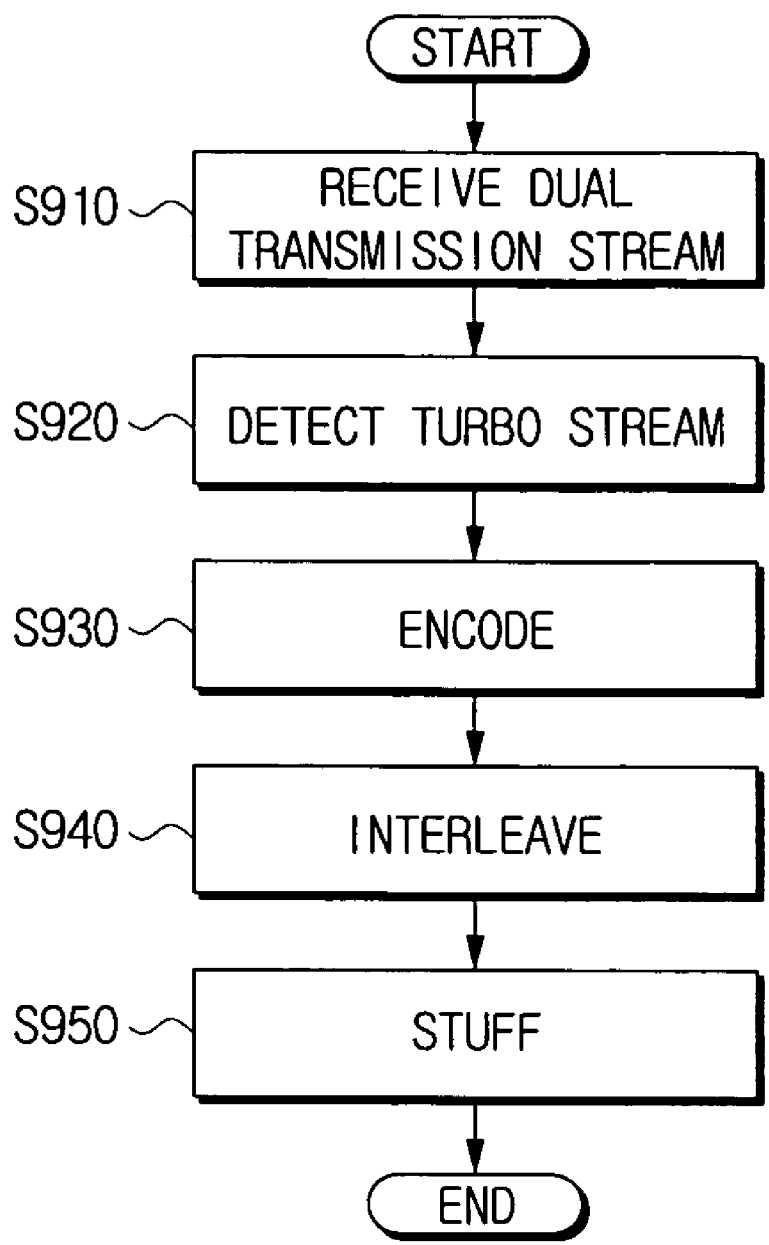
FIG. 9 is a flowchart of a turbo stream processing method according an embodiment of the present invention.

FIG. 9 is a flowchart of a turbo stream processing method according to an embodiment of the present invention. Referring to FIG. 9, the dual transmission stream is received (S910), and only the turbo stream is detected from the designated position (S920). The detected turbo stream is encoded (S930). The encoding can be carried out using the outer encoder 100 as shown in FIG. 4 and FIG. 5.

Upon the completion of the encoding, the turbo stream is interleaved (S940), and the interleaved turbo stream is stuffed into the original position of the dual transmission stream (S950). Therefore, it is possible to reconstruct the dual transmission stream to which the more robust turbo stream is inserted.

According to aspects of the present invention, the turbo stream processing device 200, embodiments of which are shown in FIGS. 3, 6, and 7, is applicable to the digital broadcasting transmission system which generates and transmits the dual transmission stream. More specifically, the digital broadcasting transmission system can include a multiplexer (MUX) (not shown) which generates the dual transmission stream by multiplexing the normal stream and the turbo stream, and an exciter (not shown) which processes and transmits the generated dual transmission stream. The turbo stream processing device 200 can be employed as a constituent of the exciter to effectively process only the turbo stream of the dual transmission stream.

In light of the foregoing, to enhance a reception performance of the ATSC VSB system which is the U.S.A. terrestrial DTV system, aspects of the present invention enable the effective encoding of the turbo stream alone in the dual transmission stream which includes the normal stream and the turbo stream. Therefore, the reception performance can be improved even in the multipath environment because only the turbo stream of the dual transmission stream is robustly processed.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A turbo stream processing device comprising:
   a byte-symbol converter to receive a bytewise dual transmission stream in which a turbo stream and a normal stream are multiplexed and to convert the dual transmission stream to symbols;
   a turbo stream detector to receive the converted dual transmission stream, and to detect the turbo stream;
   an outer encoder to encode the turbo stream;
   an outer interleaver to interleave the turbo stream which is encoded at the outer encoder;
   a turbo stream stuffer to reconstruct the dual transmission stream by stuffing the interleaved turbo stream into the dual transmission stream; and
   a symbol-byte converter to convert the dual transmission stream, which is reconstructed at the turbo stream stuffer, from the symbols to bytes.

2. The turbo stream processing device as claimed in claim 1, further comprising:
   a parity compensator to compensate for a loss of parity between the normal stream and the turbo stream and to regenerate parity of the dual transmission stream which is reconstructed at the turbo stream stuffer.

3. The turbo stream processing device as claimed in claim 1, wherein the outer encoder comprises:
   a bit detector to detect data bits from the detected turbo stream;
   an encoder to convolutionally encode the data bits; and
   a bit inserter to insert encoding values output from the encoder, into a parity insertion area provided in the turbo stream.

4. The turbo stream processing device as claimed in claim 3, wherein the encoder comprises:
   a first register to store a bit value;
   a second register to store a pre-stored value, which is shifted from the first register, when a bit value is stored to the first register;
   a third register to store a pre-stored value, which is shifted from the second register, when a bit value is stored to the second register;
   a first adder to add an input bit value, the pre-stored value of the first register, and the pre-stored value of the third register when the bit is input, and to store a resultant value to the first register; and a second adder to add the input bit value, the pre-stored value of the first register, and the pre-stored value of the second register, and to output a resultant value.

5. The turbo stream processing device as claimed in claim 3, wherein the parity insertion area is a single bit which is positioned in succession adjacent to the data bit of the turbo stream.

6. The turbo stream processing device as claimed in claim 3, wherein the parity insertion area is three bits which are positioned in succession adjacent to the data bit of the turbo stream.

7. The turbo stream processing device as claimed in claim 6, wherein the bit inserter inserts the encoding value of each data bit to first and third bits of the three bits which are positioned in succession adjacent to the data bit, and inserts a bit value identical to each data bit to a second bit of the three bits.

8. The turbo stream processing device as claimed in claim 7, wherein the three bits are positioned in succession before the data bit.

9. The turbo stream processing device as claimed in claim 7, wherein the three bits are positioned in succession after the data bit.

10. A turbo stream processing method comprising:
receiving a bytewise dual transmission stream in which a turbo stream and a normal stream are multiplexed and converting the bytewise dual transmission stream to symbols;
detecting the turbo stream from the converted dual transmission stream;
encoding the turbo stream;
interleaving the encoded turbo stream;
reconstructing the dual transmission stream by stuffing the interleaved turbo stream into the dual transmission stream; and
converting the reconstructed dual transmission stream from the symbols to bytes.

11. The turbo stream processing method as claimed in claim 10, further comprising:
compensating a parity of the reconstructed dual transmission stream.

12. The turbo stream processing method as claimed in claim 10, wherein the encoding of the turbo stream comprises:
detecting data bits from the detected turbo stream;
convolutionally encoding the detected data bits, comprising:
shifting a pre-stored bit value from a first register to a second register, when a bit value is stored to the first register,
storing a pre-stored value, which is shifted from the second register, when the bit value is stored to the second register, to a third register,
adding the detected input bit value, the pre-stored value of the first register, and the pre-stored value of the third register when the bit is input, and storing a resultant value to the first register, and
adding the detected input bit value, the pre-stored value of the first register, and the pre-stored value of the second register, and outputting a resultant value as an encoding value; and
inserting the encoding values into the parity insertion area provided in the turbo stream.

13. A turbo stream processing device to generate a robust turbo stream of a dual transmission stream comprising:
an outer encoder to receive a turbo stream from a dual transmission stream and to encode the turbo stream;
an outer interleaver to interleave the turbo stream which is encoded at the outer encoder; and
a turbo stream stuffer to reconstruct the dual transmission stream by stuffing the interleaved turbo stream into the dual transmission stream.

14. The turbo stream processing device as claimed in claim 13, wherein the dual transport stream is broadcast on the Advanced Television Systems Committee (ATSC) Vestigial Side Band (VSB) system to improve a receiving performance.

15. A turbo stream processing method, comprising:
receiving a turbo stream from a dual transmission stream;
encoding the turbo stream;
interleaving the encoded turbo stream; and
reconstructing the dual transmission stream by stuffing the interleaved turbo stream into the dual transmission stream.

16. The method as claimed in claim 15, wherein the dual transport stream is broadcast on the Advanced Television Systems Committee (ATSC) Vestigial Side Band (VSB) system to improve a receiving performance.

* * * * *